(12) United States Patent  (10) Patent No.: US 7,964,942 B2
Shirasaka et al.  (45) Date of Patent: Jun. 21, 2011

(54) LEAD FRAME HAVING A DIE STAGE SMALLER THAN A SEMICONDUCTOR DEVICE AND A SEMICONDUCTOR DEVICE USING THE SAME

(75) Inventors: Kenichi Shirasaka, Hamamatsu (JP); Hirotaka Eguchi, Aira-gun (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 11/938,742

(22) Filed: Nov. 12, 2007

(65) Prior Publication Data

US 2008/0073764 A1    Mar. 27, 2008

Related U.S. Application Data

(63) Continuation of application No. 10/853,148, filed on May 26, 2004, now abandoned.

(30) Foreign Application Priority Data

May 28, 2003  (JP) .................................. 2003-151378
Apr. 28, 2004  (JP) .................................. 2004-133376

(51) Int. Cl.
  *H01L 23/495*  (2006.01)
(52) U.S. Cl. ................. 257/676; 257/E23.037
(58) Field of Classification Search .......... 257/666–677, 257/786, E23.037–E23.04
  See application file for complete search history.

(56) References Cited

U.S. PATENT DOCUMENTS 5,661,338 A * 8/1997 Yoo et al. ...................... 257/676

| 6,291,273 | B1 * | 9/2001 | Miyaki et al. ................. 438/123 |
| 6,545,344 | B2 * | 4/2003 | Abbott .......................... 257/666 |
| 2003/0001289 | A1 * | 1/2003 | Yamada et al. ............... 257/783 |

FOREIGN PATENT DOCUMENTS

| CN | 1188439 A | 7/1998 |
| JP | 63-204753 A | 8/1988 |
| JP | 5-235248 | 9/1993 |
| JP | 5-326815 | 12/1993 |
| JP | 6-061397 | 3/1994 |
| JP | 06-084979 A | 3/1994 |
| JP | 6-232326 | 8/1994 |
| JP | 6-268143 | 9/1994 |
| JP | HEI 07-211852 | 8/1995 |
| JP | 7-335815 | 12/1995 |
| JP | 8-055954 | 2/1996 |
| JP | 10-12797 | 1/1998 |
| JP | 2000-031371 | 1/2000 |

(Continued)

*Primary Examiner* — Marcos D. Pizarro
(74) *Attorney, Agent, or Firm* — Dickstein Shapiro LLP

(57) ABSTRACT

A lead frame has a die stage for mounting a semiconductor chip whose electrodes are electrically connected with leads via bonding wires, wherein they are enclosed in a molded resin, thus producing a semiconductor device. The outline of the die stage is shaped so as to be smaller than the outline of the semiconductor chip, and a plurality of cutouts are formed in the peripheral portion of the die stage so as to reduce the overall area of the die stage and to enhance the adhesion between the die stage and molded resin. The length L2 of each cutout ranges from (L1×0.05) to (L1×0.20) where L1 denotes the length of each side of the die stage, and the overall area S2 of the die stage ranges from (S1×0.10) to (S1×0.40) where S1 denotes the overall area of the semiconductor chip.

9 Claims, 18 Drawing Sheets

FOREIGN PATENT DOCUMENTS

| | | |
|---|---|---|
| JP | 2000-049272 | 2/2000 |
| JP | 2000-286379 | 10/2000 |
| JP | 2001-127232 | 5/2001 |
| JP | 2002-246528 A | 8/2002 |
| JP | 2002-329830 A | 11/2002 |
| JP | 2003-110079 A | 4/2003 |
| JP | 2003110079 A * | 4/2003 |

* cited by examiner

| SAMPLE | CHIP SIZE | | STAGE | | CHIP AREA S1 [mm²] | STAGE AREA S2 [mm²] | S2/S1 [%] | ADHESIVE FORCE |
|---|---|---|---|---|---|---|---|---|
| | X[mm] | Y[mm] | X[mm] | Y[mm] | | | | |
| A | 9.9 | 9.9 | 9 | 9 | 98.01 | 81.00 | 83 | 0.59 |
| B | 9.9 | 9.9 | 4.2 | 4.2 | 98.01 | 17.64 | 18 | 0.91 |

FIG. 26

| SAMPLE | EXAMINED NUMBER [N] | INTERNAL CRACKS | | STAGE BACKSIDE SEPARATION | | CHIP BACKSIDE SEPARATION | | DECISION |
|---|---|---|---|---|---|---|---|---|
| | | NUMBER OF DEFECTS | DEFECT RATIO[%] | NUMBER | RATIO [%] | NUMBER | RATIO [%] | |
| A | 11 | 3 | 27 | 11 | 100 | 9 | 82 | NO GOOD |
| B | 111 | 0 | 0 | 110 | 100 | 16 | 15 | OK |

FIG. 27

LEAD FRAME HAVING A DIE STAGE SMALLER THAN A SEMICONDUCTOR DEVICE AND A SEMICONDUCTOR DEVICE USING THE SAME

CROSS-REFERENCE TO RELATED APPLICATIONS

This application is a continuation of U.S. patent application Ser. No. 10/853,148, filed May 26, 2004, the entirety of which is incorporated herein by reference.

BACKGROUND OF THE INVENTION

1. Field of the Invention

This invention relates to lead frames and semiconductor devices in which semiconductor chips mounted on lead frames are encapsulated in resins.

This application claims priority based on Japanese Patent Application No. 2003-151378 and Japanese Patent Application No. 2004-133376, the contents of which are incorporated herein by reference.

2. Description of the Related Art

FIGS. 19 and 20 show an example of a semiconductor device (designated by reference numeral '20') encapsulated in a resin, and comprises a lead frame 11 made of a prescribed metal such as Cu alloy and 42 alloy, a semiconductor chip 18 that is joined with the upper surface of a die stage 12 of the lead frame 11 via a joining material 17 such as Ag paste and solder paste, a plurality of bonding wires 16 that electrically connect together electrodes of the semiconductor chip 18 and leads 15 of the lead frame 11, and a molded resin 19 made of a thermosetting resin such as epoxy resin for enclosing inner leads 15a of the leads 15, etc.

The semiconductor device 20 having the aforementioned constitution is temporarily mounted at a prescribed position of a circuit board, which is installed in an electronic device, and is then subjected to reflow soldering in which solder paste is melted and then solidified so that outer leads 15b of the leads 15 electrically join the circuit board, whereby it is possible to reliably mount the semiconductor device 20 at the prescribed position of the circuit board.

Conventionally, Sn—Pb solder (or Sn—Pb alloy) is used for the semiconductor device 20 to be mounted on the circuit board, wherein since a toxic substance such as lead (Pb) contained in the Sn—Pb solder may cause possible destruction of the natural environment and may have bad effects on human bodies, the Sn—Pb solder is recently being replaced with non-lead solder such as Sn—Ag—Cu alloy.

The non-lead solder may be advantageous for the protection of the environment because it does not contain toxic substance (or harmful material) such as lead (Pb); however, the melting point thereof (about 217° C.) is higher than that of the Sb—Pn solder (about 183° C.); therefore, it is necessary to increase the heating temperature in reflow soldering, whereby it is necessary to correspondingly increase the heat resistance in soldering with respect to the semiconductor device 20.

When the aforementioned semiconductor device 20 is heated upon reflow soldering, there occur easy-to-separate portions and hard-to-separate portions due to the relationship between different materials used for the constituent elements thereof. That is, relatively high adhesion is established in the boundary between the semiconductor chip 10 made of silicon and the molded resin 19, which may be therefore hard to separate from each other, while relatively low adhesion is established in the boundary between the die stage 12 made of the prescribed metal such as 42 alloy and the molded resin 19, which may be therefore easy to separate from each other. When separation occurs in the boundary between the die stage 12 and the molded resin 19, due to impact caused by the separation, the separated area extends towards the boundary between the semiconductor chip 18 and the molded resin 19, whereby it may grow as a crack (or cracks) so as to unexpectedly break the bonding wires 16. Such a phenomenon appears remarkably as the heating temperature in the reflow soldering becomes higher; hence, it is necessary to take appropriate measures to avoid occurrence this phenomenon.

Japanese Patent Application Publication No. 2000-49272 (see pages 4-5 and 7, as well as FIGS. 1, 2, and 19) discloses another example of a semiconductor device (designated by reference numeral '30') in which as shown in FIGS. 21 to 23, a die stage 22 of a lead frame 21 is formed in an X-shape so as to reduce the overall joining area formed between the die stage 22 and a molded resin 29.

Japanese Patent Application Publication No. H07-211852 (see pages 2 and 4 as well as FIGS. 5 and 11) discloses a further example of a semiconductor device (designated by reference numeral '40') in which as shown in FIGS. 24 and 25, an opening 32a is formed at the center portion of a die stage 32 of a lead frame 31 so as to reduce the overall joining area between the die stage 32 and a molded resin 39.

The aforementioned semiconductor device 30 is designed to reduce the adhered area formed between the die stage 22 and the molded resin 29 so that the separated area appearing in the boundary between them can be reduced, whereby it may be difficult for the separated area to extend towards the boundary between the semiconductor chip and the molded resin, regardless of the impact caused by the separation. However, when the semiconductor device 30 is joined to the circuit board by use of non-lead solder having a high melting point, separation may be easily caused due to heating.

In the semiconductor device 40, the peripheral portion of the die stage 32 extends outside of the peripheral portion of the semiconductor chip 38, so that separation may occur in such an 'extended' peripheral portion to cause impact by which the separated area may be further extended towards the boundary between the semiconductor chip 38 and the molded resin 39, whereby it may grow as a crack (or cracks) so as to unexpectedly break bonding wires 36.

SUMMARY OF THE INVENTION

It is an object of the invention to provide a lead frame and a semiconductor device, wherein bonding wires are not broken due to cracks unexpectedly formed in a molded resin in a heating step when the semiconductor device is mounted on a circuit board.

It is another object of the invention to provide a lead frame and a semiconductor device which can be manufactured at a high yield and therefore contribute to the protection of the environment.

A lead frame of this invention has a die stage for mounting a semiconductor chip thereon and is enclosed in a molded resin such that the semiconductor chip is adhered to the upper surface of the die stage, thus producing a semiconductor device, wherein the outline of the die stage is shaped to be smaller than the outline of the semiconductor chip, and a plurality of cutouts are formed on the respective sides of the die stage so as to reduce the overall area of the die stage.

In the above, the die stage has a rectangular shape (or a square shape), and the cutouts are formed inwardly in the peripheral area corresponding to the four sides of the die stage. Herein, each of the cutouts has a semicircular shape whose length L2 is defined in a range from (L1×0.05) to (L1×0.20) where 'L1' denotes the length of each side of the die stage. In addition, the overall area S2 of the die stage is defined in a range from (S1×0.10) to (S1×0.40) where 'S1' denotes the overall area of the semiconductor chip.

The joined area between the die stage and the semiconductor chip that are firmly joined together is surrounded by the molded resin introduced into the cutouts of the die stage; therefore, it is possible to establish a firmly joined state between the semiconductor chip and the molded resin inside of the cutouts of the die stage. Hence, even when separation occurs in the boundary between the die stage and the molded resin, it does not extend towards the boundary between the semiconductor chip and the molded resin. That is, it is possible to prevent the separation from growing as cracks causing possible breaks of bonding wires.

The aforementioned relationships defined between L1 and L2 and between S1 and S2 guarantee a high joining strength between the die stage and the semiconductor chip so as to prevent separation from occurring in the boundary between the semiconductor chip and the molded resin.

When the semiconductor device is installed in an electronic device, the aforementioned lead frame is joined with a circuit board by use of non-lead solder, which does not contain a toxic substance, thus contributing to the protection of the environment during manufacturing.

BRIEF DESCRIPTION OF THE DRAWINGS

These and other objects, aspects, and embodiments of the present invention will be described in more detail with reference to the following drawings, in which:

FIG. 26 shows a comparison between samples with respect to their dimensions and adhesive forces; and FIG. 27 shows a comparison between samples with respect to their defects.

DESCRIPTION OF THE PREFERRED EMBODIMENTS

This invention will be described in further detail by way of examples with reference to the accompanying drawings.

Figure 1:
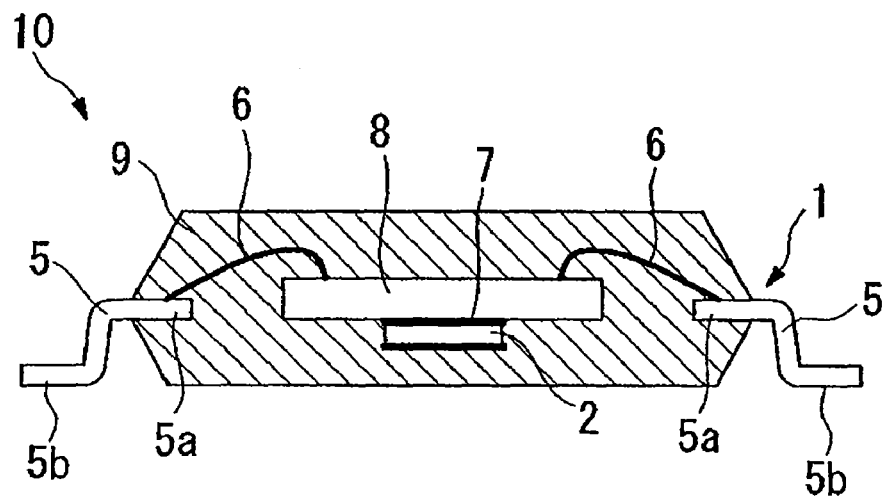
FIG. 1 is a cross sectional view showing the constitution of a semiconductor device having a lead frame in accordance with a first embodiment of the invention.
Figure 2:
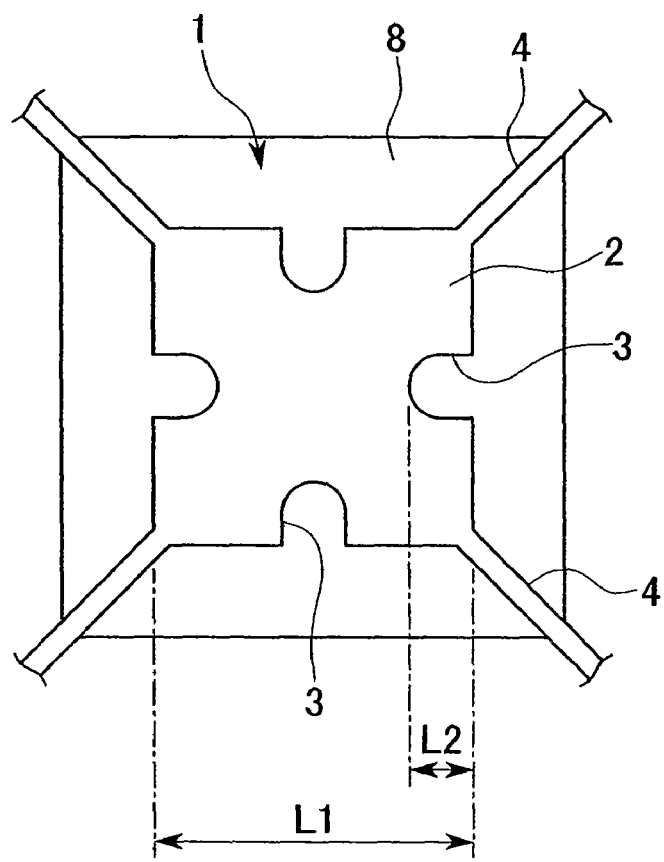
FIG. 2 is an illustration diagrammatically showing the lead frame having a die stage of a prescribed shape, which is observed from the backside.
Figure 3:
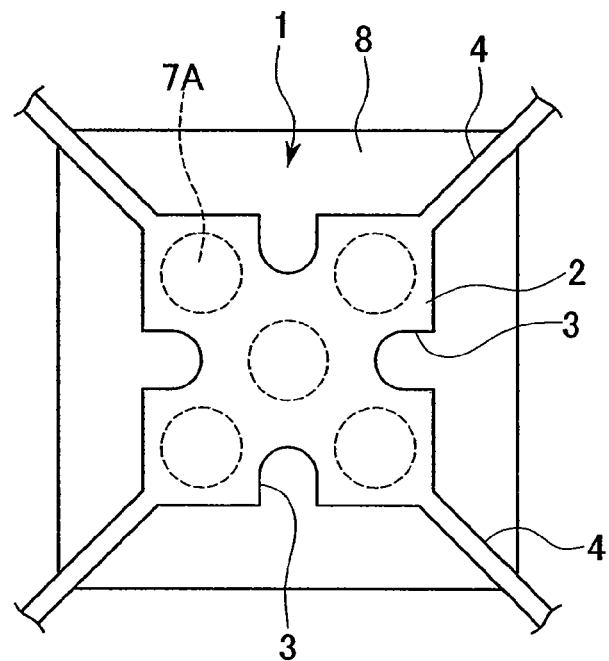
FIG. 3 is an illustration diagrammatically showing applied areas of a joining material on the die stage shown in FIG. 2.

FIGS. 1 to 3 show a lead frame 1 and a semiconductor device 10 in accordance with a first embodiment of the invention. The lead frame 1 is produced using a thin plate made of a prescribed metal such as Cu alloy and 42 alloy, which is subjected to etching and is then subjected to die pressing, so that it is formed in a prescribed shape. Specifically, the lead frame 1 comprises a die stage 2 in which a semiconductor chip 8 is mounted on the upper surface, a plurality of stays 4 for supporting the die stage 2, and a plurality of leads 5 that are arranged outside of the die stage 2 and are electrically connected with electrodes of the semiconductor chip 8.

The die stage 2 is formed in a prescribed shape to match the shape of the semiconductor chip 8. In the present embodiment, the die stage 2 as a whole is roughly formed in a rectangular shape to match the rectangular shape of the semiconductor chip 8 as shown in FIGS. 2 and 3.

The overall area of the die stage 2 is reduced so as to be smaller than that of the semiconductor chip 8 (i.e., the backside area of the semiconductor chip 8 mounted on the die stage 2), wherein the outline shape of the die stage 2 is formed so as to be completely encompassed inside of the outline shape of the semiconductor chip 8. Hence, when the semiconductor chip 8 is mounted on the die stage 2, the peripheral portion of the semiconductor chip 8 having the prescribed area extends outside of the peripheral portion of the die stage 2.

Semicircular cutouts 3 are respectively formed at the centers of the four sides of the die stage 2, which is thus reduced in the overall area. Therefore, when the semiconductor chip 8 is mounted on the upper surface of the die stage 2, prescribed parts of the backside of the semiconductor chip 8 matching the semicircular cutouts 3 of the die stage 2 are exposed towards the backside of the semiconductor chip 8.

In the above, each of the semicircular cutouts 3 is cut inside of the die stage 2 by a prescribed length L2, which is set within a range defined by the following equation (1) (where L1 denotes the length of each side of the die stage 2).

$$L2 = (L1 \times 0.05) \text{ to } (L1 \times 0.20) \tag{1}$$

Backside area S2 of the die stage 2 excluding the cutouts 3 is set within a range defined by the following equation (2) (where S1 denotes the backside area of the semiconductor chip 8 mounted on the upper surface of the die stage 2).

$$S2 = (S1 \times 0.10) \text{ to } (S1 \times 0.40) \tag{2}$$

The stays 4 are formed integrally together with the die stage 2 and are arranged in a radial manner with respect to the four corners of the die stage 2, whereby the die stage 2 is reliably supported by the stays 4.

As shown in FIG. 1, the leads 5 are arranged with prescribed distances therebetween outside of the die stage 2 so as to surround the die stage 2, wherein each of the leads 5 is constituted by an inner lead 5a, which is arranged inside of the semiconductor device 10, and an outer lead 5b, which is arranged outside of the semiconductor device 10.

The inner leads 5a of the leads 5 are electrically connected with electrodes of the semiconductor chip 8 via bonding wires 6, and the outer leads 5b are electrically joined with a circuit board (not shown) installed in an electronic device (not shown) via solder.

When the lead frame 1 having the aforementioned constitution is used to produce the semiconductor device 10, a die bonding step is firstly performed in such a way that an appropriate amount of a joining material 7 such as Ag paste and non-lead solder (e.g., Sn—Ag—Cu alloy) is applied onto the upper surface of the die stage 2 of the lead frame 1, wherein the semiconductor chip 8 is mounted on the upper surface of the die stage 2 and pressed by a prescribed load while the joining material 7 is melted and then solidified, so that the semiconductor chip 8 is integrally joined on the upper surface of the die stage 2.

In the above, the Ag paste and the like is applied to the upper surface of the die stage 2 at prescribed areas 7A (encompassed by dotted circles in FIG. 3), which are located so as to avoid the cutouts 3. Therefore, the cutouts 3 of the die stage 2 do not interfere with the application of the joining material 7.

Next, in a wire bonding step, the electrodes of the semiconductor chip 8 are electrically connected with the inner leads 5a of the leads 5 by way of the bonding wires 6 such as metal wires.

Next, in a molding step, the lead frame 1 is placed in a cavity of a metal mold consisting of an upper mold and a lower mold, which is then filled with a thermosetting resin such as epoxy resin, which is injected into the cavity and is then hardened. Thus, it is possible to enclose the semiconductor chip 8, die stage 2, bonding wires 6, and inner leads 5a of the leads 5 within a molded resin 9 made of the thermosetting resin.

In the above, the molded resin 9 flows into the cutouts 3 of the die stage 2 to join the backside of the semiconductor chip 8, so that the molded resin 9 is partially formed inside of the cutouts 3 of the die stage 2.

Next, in a lead surface processing step, non-lead solder plating is performed on prescribed portions of the leads 5, which project outside of the molded resin 9, as necessary, so that rust is prevented from occurring on the leads 5. This makes it easy to perform soldering work when the semiconductor device 10 is mounted on the circuit board.

Next, in a cutting and forming step, unnecessary parts of the leads are cut out so that the leads 5 are defined in prescribed lengths, wherein the outer leads 5b are subjected to bending so that they are formed in prescribed shapes.

Thus, it is possible to produce the semiconductor device 10 by way of the aforementioned steps. Then, the semiconductor device 10 having the aforementioned constitution is temporarily mounted on the circuit board at the prescribed position, wherein non-lead solder is subjected to melting and solidification upon reflow soldering, and the outer leads 5b of the leads 5 are electrically joined with the circuit board. Thus, it is possible to firmly mount the semiconductor device 10 on the circuit board at the prescribed position.

In the semiconductor device 10 having the aforementioned lead frame 1, even when the semiconductor device 10 is heated upon reflow soldering so that separation may occur between the die stage 2 and the molded resin 9, it is possible to avoid the occurrence of separation between the semiconductor chip 8 and the molded resin 9 as well as the occurrence of breaks of the bonding wires 6.

The present embodiment is characterized in that the outline of the die stage 2 is shaped to be smaller than the outline of the semiconductor chip 8 so that the overall area of the die stage 2 is reduced so as to be smaller than that of the semiconductor chip 8, whereby when the semiconductor chip 8 is mounted on the upper surface of the die stage 2, the peripheral portion of the semiconductor chip 8 partially extends outside of the peripheral portion of the die stage 2. Thus, it is possible to minimize the separated area, which may be easily formed in the peripheral portion of the die stage 2 when the semiconductor device 10 is mounted on the circuit board upon heating. Hence, even when separation occurs between the die stage 2 and the molded resin 9, it can be reliably prevented from extending towards the boundary between the semiconductor chip 8 and the molded resin 9, whereby it is possible to reliably prevent the bonding wires 6 from being unexpectedly broken due to the formation of cracks, which may be caused by the separation.

The semiconductor chip 8 is soldered to the die stage 2; hence, they can be firmly joined together. That is, the adhered areas formed between the semiconductor chip 8 and the molded resin 9 inside of the cutouts 3 of the die stage 2 are encompassed by the firmly joined areas between the die stage 2 and the semiconductor chip 8; hence, it is possible to establish a firmly adhered state between the semiconductor chip 8 and the molded resin 9 inside of the cutouts 3 of the die stage 2. In addition, the molded resin 9 itself can be engaged inside of the cutouts 3 of the die stage 2; hence, it is very difficult for both of the molded resin 9 and the die stage 2 to mutually move from each other in prescribed directions matching the four sides of the die stage 2. Therefore, even though separation occurs between the die stage 2 and the molded resin 9, it does not extend towards the boundary between the semiconductor chip 8 and the molded resin 9, and it does not grow as cracks to unexpectedly break the bonding wires 6.

In addition, the present embodiment introduces the relationship between the length L1 of each side of the rectangularly-shaped die stage 2, and the length L2, by which each cutout 3 is formed inwardly into each side of the die stage 2, as defined in the aforementioned equation (1), whereby it is possible to increase the joining strength so as to be higher with respect to the die stage 2.

Even though non-lead solder, which does not contain a toxic substance such as lead (Pb), is used when the lead frame is joined together with the circuit board as an environmental countermeasure, cracks are not produced in the molded resin 9 upon heating when the semiconductor device is firmly mounted on the circuit board so as to unexpectedly break the bonding wires 6; hence, it is possible to increase the yield in the actual manufacturing of the electronic device.

Furthermore, the present embodiment introduces the relationship between the backside area S1 of the semiconductor chip 8 and the backside area S2 of the die stage 2 as defined in the aforementioned equation (2), whereby it is possible to increase the joining strength so as to be higher with respect to the die stage 2.

The aforementioned range defined in equation (2) can be explained using an example of the semiconductor device, which is designed with the following dimensions.

That is, there is provided an example of a semiconductor chip having a square shape whose one side length is set to 4 mm, and an example of a die stage having a square shape in which semicircular cutouts are formed on respective sides, wherein the semiconductor chip and the die stage are joined together and are then integrally enclosed in a molded resin. Herein, the length L2 of each semicircular cutout is set to (L1×0.20).

Figure 4:
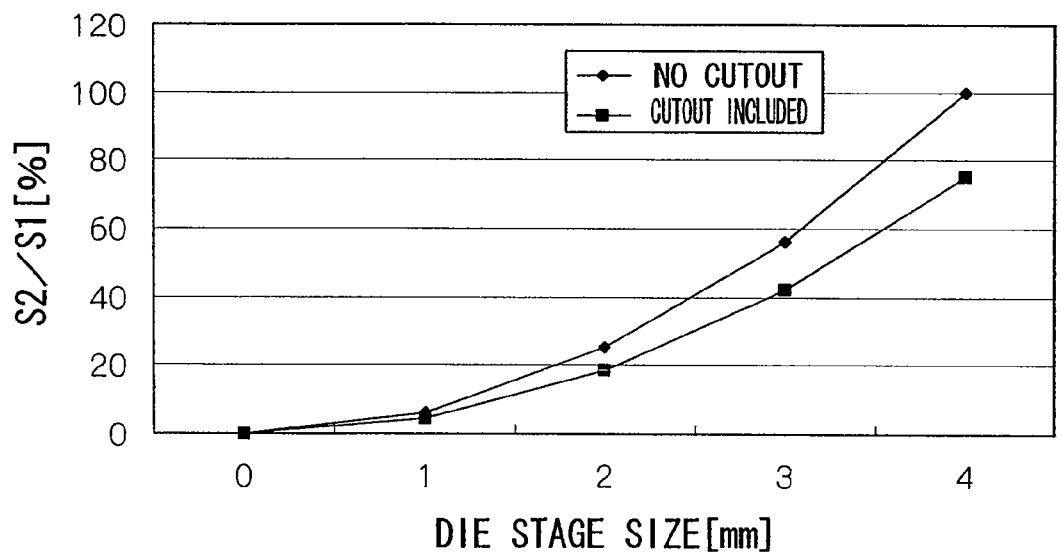
FIG. 4 is a graph showing variations of S2/S1 ratio between the backside area (S2) of a die stage and the backside area (S1) of a semiconductor chip having 4 mm×4 mm dimensions.

FIG. 4 shows variations of a ratio S2/S1 [%], i.e., a ratio of the backside area S2 of the die stage to the backside area S1 (=16 mm$^2$) of the semiconductor chip, wherein each side of the die stage is varied in length. The graph of FIG. 4 shows a comparison between the aforementioned example of the semiconductor device, in which cutouts are formed on the respective sides of the die stage, and a comparative example of the semiconductor device, in which no cutout is formed in the die stage, in terms of the aforementioned parameter of S2/S1.

In addition, a so-called adhesive force (or adhesive factor) is introduced to assess the adhesive property of the semiconductor device, wherein the adhesive force established between the semiconductor chip and the molded resin is normally set to 1.00, while the adhesive force established between the die stage and the molded resin is decreased to 0.50 when adhesion is weakened. Specifically, the adhesive force can be described as follows:

FIG. 26 shows a comparison between "Sample A", in which the semiconductor chip has a square shape whose one side length is set to 9.9 mm and the die stage has a square shape whose one side length is set to 9 mm, and "Sample B" in which the semiconductor chip has the same dimensions described above while the die stage has a square shape whose one side length is set to 4.2 mm, wherein both of Samples A and B do not provide cutouts in the die stages thereof.

These Samples A and B are subjected to full water content conditions; specifically, in the pretreatment processing, they are initially exposed to a temperature of 125° C. for 24 hours, then exposed to a temperature of 85° C. under 30% humidity for 336 hours, and further exposed to a temperature of 30° C. under 70% humidity for 216 hours, so that water content is sufficiently filtrated into them. Then, they are subjected to a heating process at 260° C. for 10 seconds, i.e., under conditions simulating the actual reflow conditions, wherein they are subjected to reflowing twice such that they are heated to 265° C. Thereafter, ultrasonic examination equipment is used to perform an examination as to the formation of cracks inside of the semiconductor device, the occurrence of separation regarding the die stage, and the occurrence of separation regarding the backside of the semiconductor chip. Results are shown in FIG. 27, wherein separation inevitably occurs on the backside area of the die stage and the backside of the semiconductor chip due to acceleration testing.

FIG. 27 shows that since the adhesive force between the die stage and the molded resin is relatively weak, the stage backside separation ratio is 100% with respect to both of Samples A and B, while the chip backside separation ratio is 82% with respect to Sample A in which S2/S1=83%, and the chip backside separation ratio is 15% with respect to Sample B in which S2/S1=18%, wherein it can be said that the chip backside separation ratio is roughly in proportion to the ratio of the backside area S2 of the die stage to the backside area S1 of the semiconductor chip, i.e., S2/S1. That is, when both of the backside of the semiconductor chip and the backside of the die stage are exposed at an equal ratio, in other words, when S2/S1=50%, it is assumed that the stage backside separation ratio is 100% while the chip backside separation ratio is 50%, wherein it can be said that, under the same conditions for the comparison, the stage backside separation ratio becomes double the chip backside separation ratio. This is because the occurrence of separation may greatly depend upon the adhesive force of the molded resin; hence, when the adhesive force between the semiconductor chip and the molded resin is 1.00, it is assumed that the adhesive force between the die stage and the molded resin is 0.50. For this reason, it is presumed that the semiconductor chip joins the molded resin with an adhesive force of 1.00 in relation to the area (S1-S2), in which the backside area S2 of the die stage is subtracted from the backside area S1 of the semiconductor chip, while the die stage joins the molded resin with an adhesive force of 0.50 in relation to the backside area S2 of the die stage. Therefore, the prescribed adhesive forces as shown in the rightmost column of FIG. 26 can be defined with respect to Samples A and B respectively. Such definitions for adhesive forces can be used for the assessment of semiconductor devices.

Figure 5:
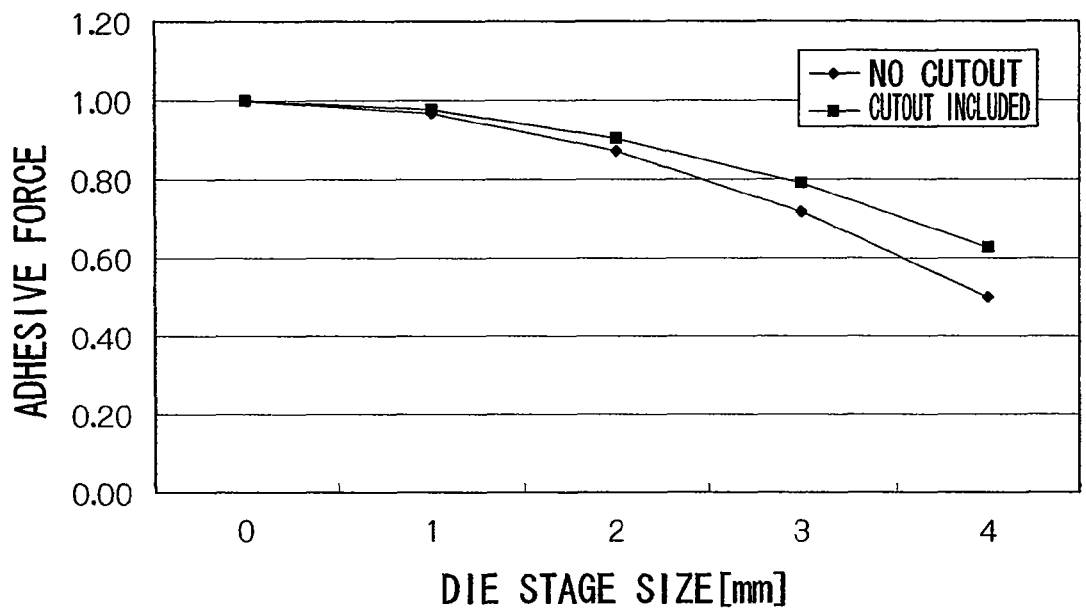
FIG. 5 is a graph showing variations of adhesive force established between the die stage and the semiconductor chip having 4 mm×4 mm dimensions.

Under the conditions where the semiconductor chip 8 joins the die stage, the semiconductor chip 8 joins the molded resin 9 at an adhesive force of 1.00 in relation to the 'exposed' backside area of the semiconductor chip 8, i.e., the aforementioned area (S1-S2), in which the backside area S2 of the die stage 2 excluding the cutouts 3 is subtracted from the backside area S1 of the semiconductor chip 8, while the die stage 2 joins the molded resin 9 at an adhesive force of 0.50 in relation to the backside area S2 of the die stage 2. FIG. 5 shows variations of the adhesive force regarding the molded resin 9 that is adhered with the semiconductor chip 8 and the die stage 2, which join together, when one side length of the die stage 2 is varied in consideration of the aforementioned description, wherein two curves are drawn with respect to the formation of the cutouts 3 in the die stage 2.

It is preferable that in order to secure a sufficiently high joining strength regarding the die stage 2, the adhesive force be 0.80 or more. With reference to FIGS. 4 and 5, the range guaranteeing an adhesive force of 0.80 or more can be converted to the range of the aforementioned ratio S2/S1, which is about 40% or less. In order to secure a relatively high adhesive established between the semiconductor chip 8 and the die stage 2, it is preferable that the ratio S2/S1 be approximately 10% or more. That is, it is preferable that the ratio S2/S1 range from 10% to 40%, based on which the aforementioned equation (2) can be estimated.

In short, as long as the aforementioned equation (2) is satisfied, even when the lead frame of the semiconductor device is joined with the circuit board by use of non-lead solder not including a toxic substance such as lead (Pb), it is possible to avoid the occurrence of an event in which, due to the heating performed when the semiconductor device is joined with the circuit board, cracks are formed in the molded resin so as to unexpectedly break the bonding wires; thus, it is possible to increase the yield in manufacturing electronic devices.

To satisfy the aforementioned equation (2) in which the ratio S2/S1 is approximately 18%, for example, a semiconductor chip having a square shape whose one side length is set to 4 mm is joined together with a die stage having a square shape whose one side length is set to 2 mm in which cutouts are formed on respective sides, wherein they are integrally enclosed in a molded resin so as to produce a semiconductor device, which is now placed under assessment as follows:

In the assessment, the semiconductor device is subjected to baking at a temperature of 125° C. for 24 hours, humidification of 30% at 85° C. for 168 hours, humification of 70% at 30° C. for 120 hours, and heating during reflow soldering at a peak temperature of 265° C. for 10 seconds 2 times. In this case, no separation is found with respect to the die stage; thus, very good results can be obtained.

Figure 6:
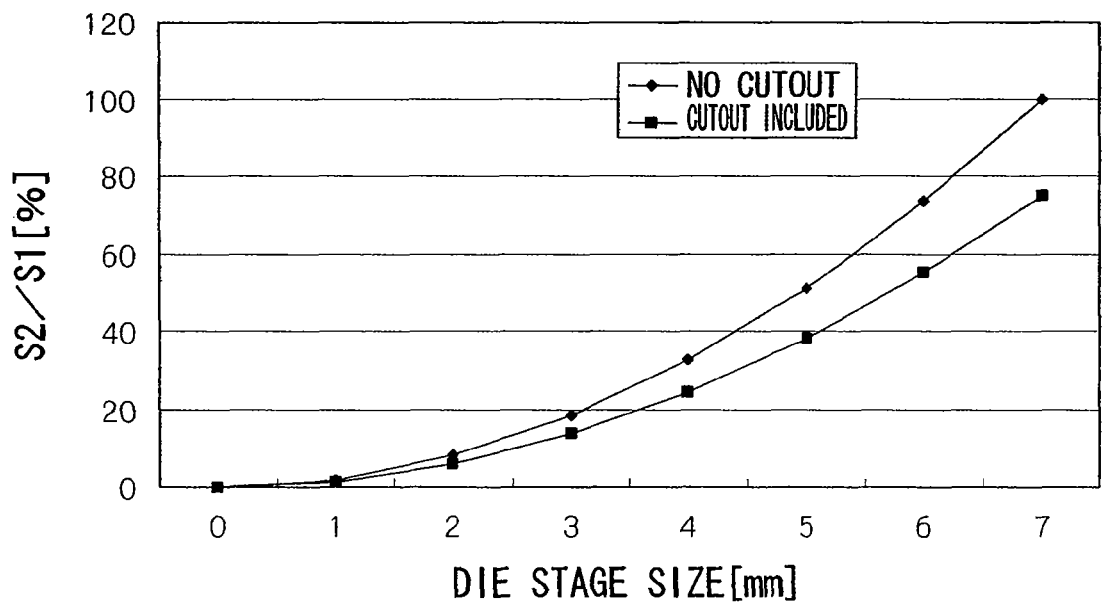
FIG. 6 is a graph showing variations of the S2/S1 ratio between the backside area (S2) of a die stage and the backside area (S1) of a semiconductor chip having 7 mm×7 mm dimensions.
Figure 7:
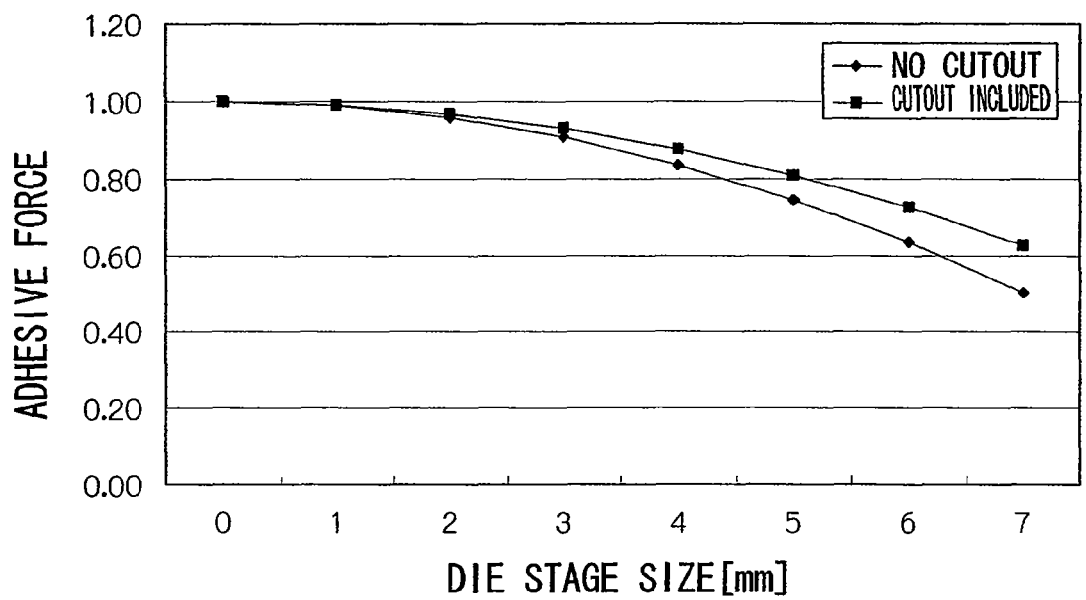
FIG. 7 is a graph showing variations of the adhesive force established between the die stage and the semiconductor chip having 7 mm×7 mm dimensions.
Figure 8:
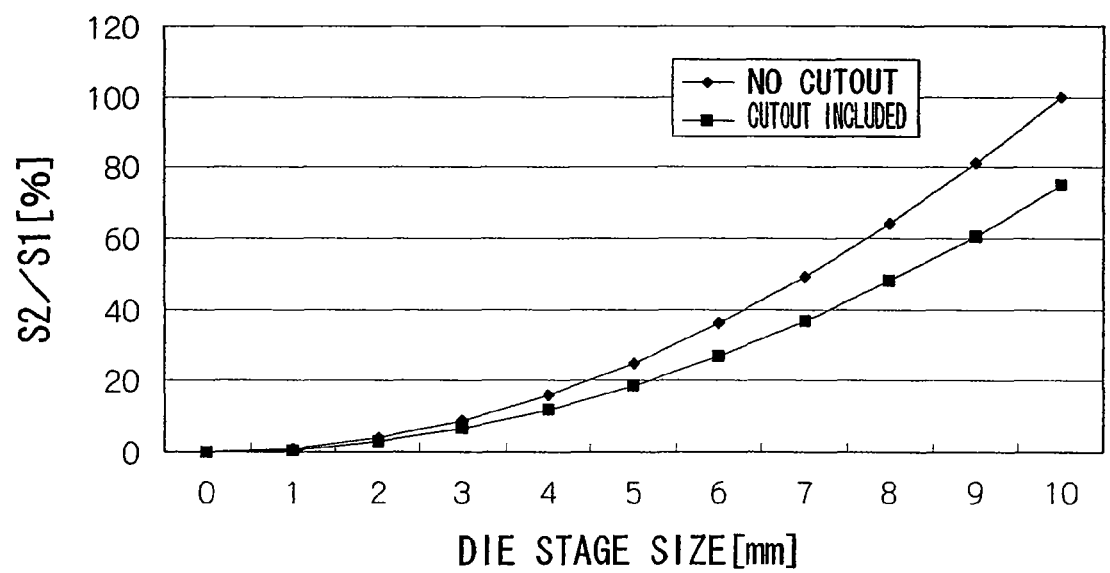
FIG. 8 is a graph showing variations of the S2/S1 ratio between the backside area (S2) of a die stage and the backside area (S1) of a semiconductor chip having 10 mm×10 mm dimensions.
Figure 9:
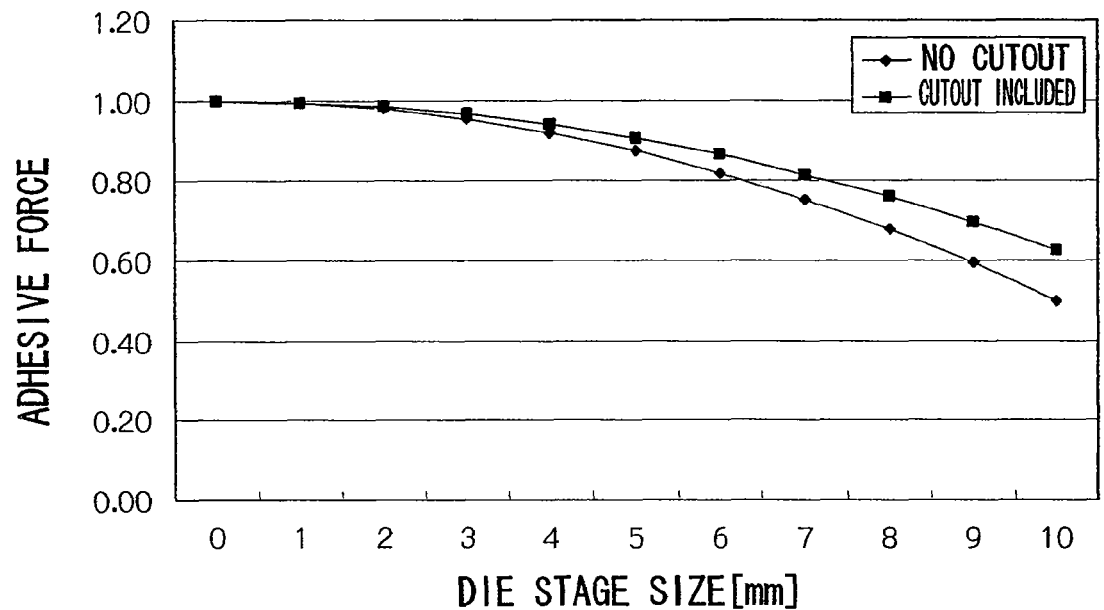
FIG. 9 is a graph showing variations of the adhesive force established between the die stage and the semiconductor chip having 10 mm×10 mm dimensions.
Figure 10:
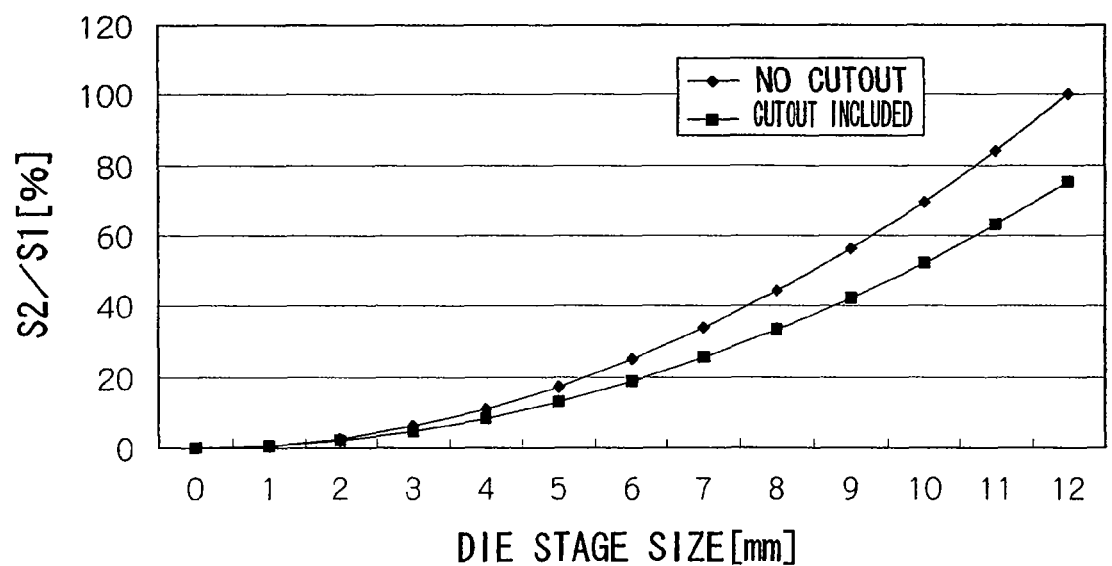
FIG. 10 is a graph showing variations of the S2/S1 ratio between the backside area (S2) of a die stage and the backside area (S1) of a semiconductor chip having 12 mm×12 mm dimensions.
Figure 11:
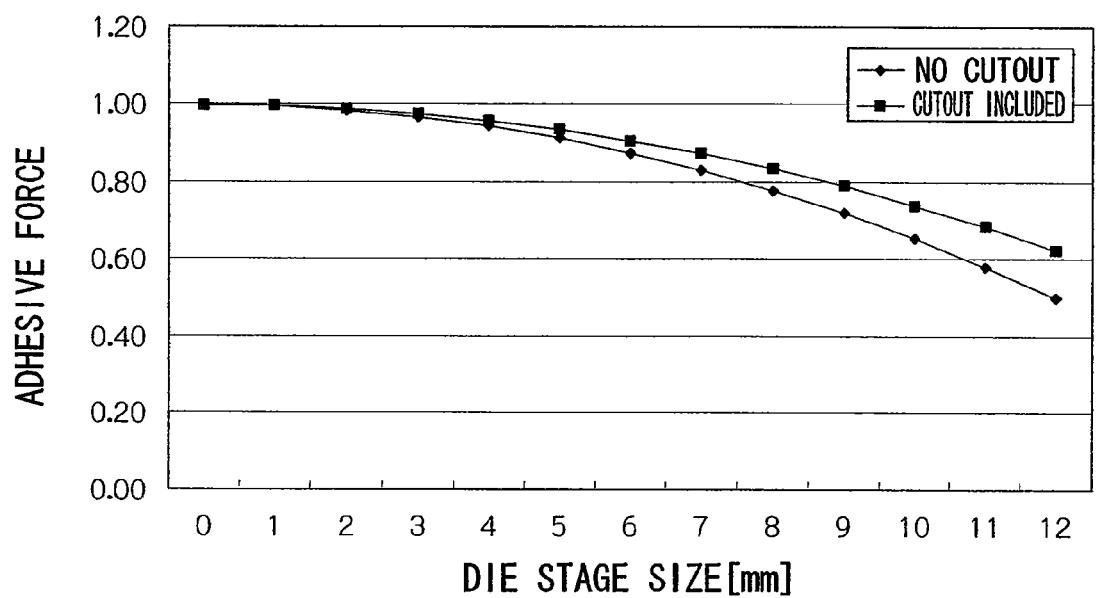
FIG. 11 is a graph showing variations of the adhesive force established between the die stage and the semiconductor chip having 12 mm×12 mm dimensions.

FIGS. 6, 8, and 10 show variations of the aforementioned ratio S2/S1 in relation to variations of one side length of the die stage with respect to three types of square-shaped semiconductor chips having 7 mm×7 mm dimensions, 10 mm×10 mm dimensions, and 12 mm×12 mm dimensions, respectively. In addition, FIGS. 7, 9, and 11 show variations of the adhesive force with respect to the three types of the square-shaped semiconductor chips, respectively. Through these graphs, the range of the adhesive force of 0.80 or more can be translated into the range of the ratio S2/S1 of about 40% or less, wherein since it is preferable that the ratio S2/S1 be approximately 10% or more, it can be generally said that the semiconductor device should satisfy the aforementioned equation (2).

Next, a second embodiment of the invention will be described, wherein parts identical to those used in the first embodiment are designated by the same reference numerals; hence, the detailed description thereof will be omitted.

Figure 12A:
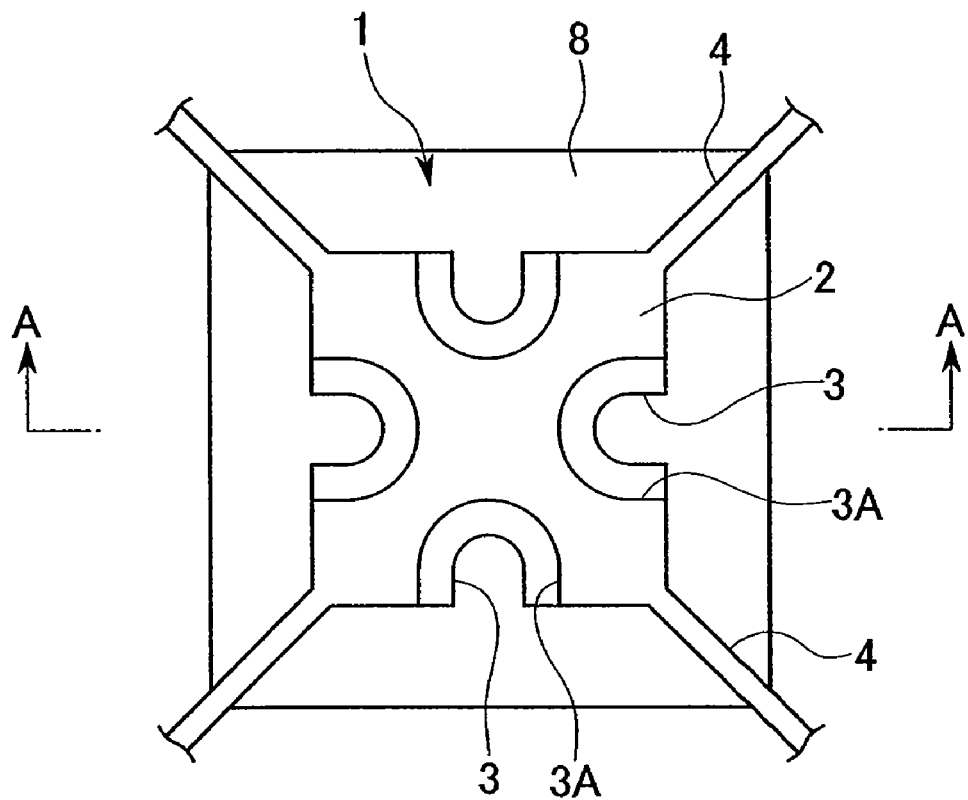
FIG. 12A is a backside view diagrammatically showing a semiconductor chip and a die stage of a lead frame in accordance with a second embodiment of the invention.
Figure 12B:
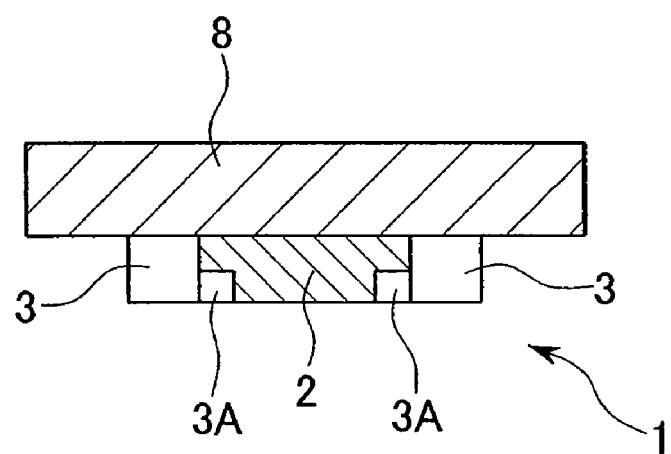
FIG. 12B is a cross sectional view taken along line A-A in FIG. 12A.

FIGS. 12A and 12B show the lead frame 1 and the semiconductor device 10 in accordance with the second embodiment of the invention, wherein in addition to the foregoing cutouts 3 that are formed at the centers of the respective sides of the die stage 2, secondary cutouts 3A are formed so as to encompass the cutouts 3 inwardly of the die stage 2 whose backside is subjected to half etching.

Each of the secondary cutouts 3A is opened with respect to the cutouts 3 and the backside of the die stage 2, wherein in the foregoing molding step, the molded resin 9 flows into the secondary cutouts 3A in addition to the cutouts 3 of the die stage 2.

The second embodiment can offer the same effects as demonstrated by the first embodiment. In addition, due to the formation of the secondary cutouts 3A, the overall adhered area is reduced in the same plane formed between the backside of the die stage 2 and the molded resin 9 so that the stress therein is dispersed; hence, it is possible to make it difficult for separation to occur between the die stage 2 and the molded resin 9. Such an effect can be obtained by making the backside of the die stage 2 roughly by use of a sand blaster and the like.

Next, a third embodiment of the invention will be described, wherein parts identical to those used in the first and second embodiments are designated by the same reference numerals; hence, the detailed description thereof will be omitted.

Figure 13A:
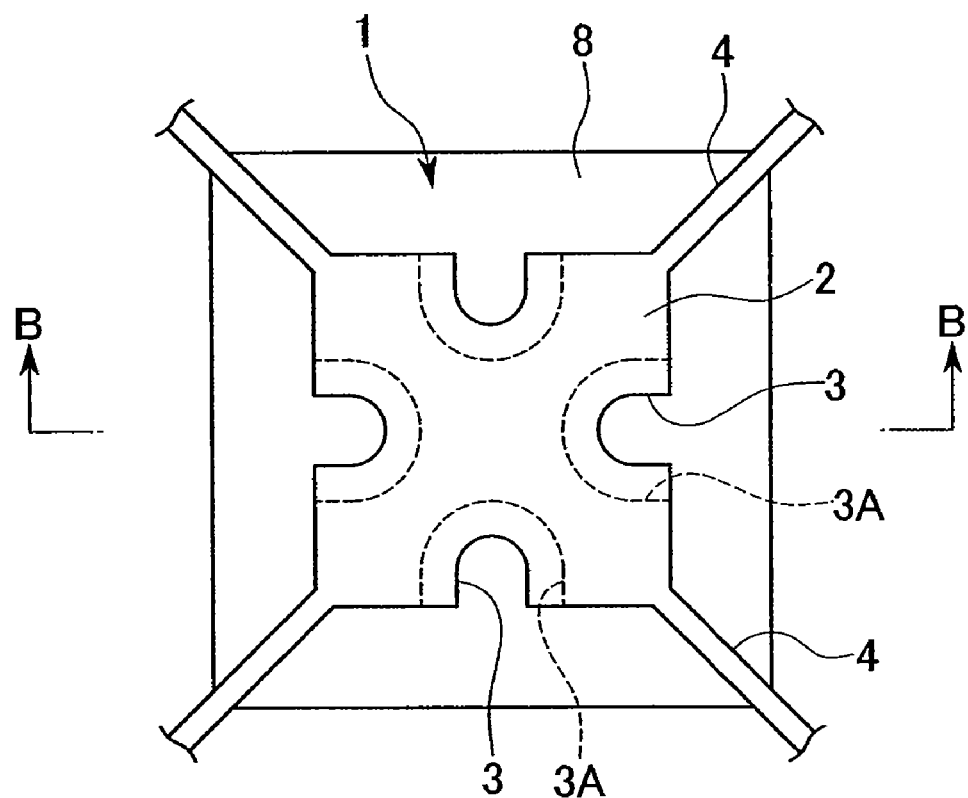
FIG. 13A is a backside view diagrammatically showing a semiconductor chip and a die stage of a lead frame in accordance with a third embodiment of the invention.
Figure 13B:
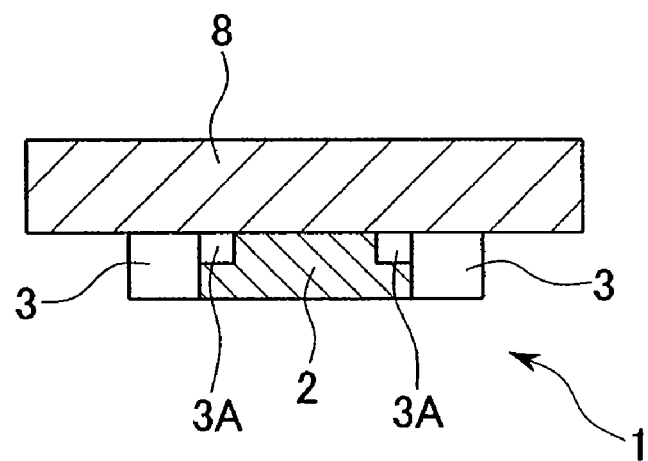
FIG. 13B is a cross sectional view take along line B-B in FIG. 13A.

FIGS. 13A and 13B show the lead frame 1 and the semiconductor device 10 in accordance with the third embodiment of the invention, wherein the secondary cutouts 3A are formed by performing half etching on the upper surface of the die stage 2 so as to encompass the semicircular cutouts 3, which are formed at the centers of the respective sides of the die stage 2.

The secondary cutouts 3A are opened in the cutouts 3 on the upper surface of the die stage 2, wherein in the foregoing molding step, the molded resin 9 is introduced into the secondary cutouts 3A in addition to the cutouts 3, so that the molded resin 9 partially formed inside of the secondary cutouts 3 is joined to the backside of the semiconductor chip 8.

The third embodiment can demonstrate the same effects as offered in the first embodiment, wherein due to the formation of the secondary cutouts 3A, it is possible to increase the overall contact area between the semiconductor chip 8 and the molded resin 9. In addition, the secondary cutouts 3A are formed in the side of the upper surface of the die stage 2; hence, in the foregoing wire bonding step, it is possible to maintain the stable condition secured for the die stage 2, which serves as the base for mounting the semiconductor chip 8.

Next, a fourth embodiment of the invention will be described, wherein parts identical to those used in the first to third embodiments are designated by the same reference numerals; hence, the detailed description thereof will be omitted.

Figure 14:
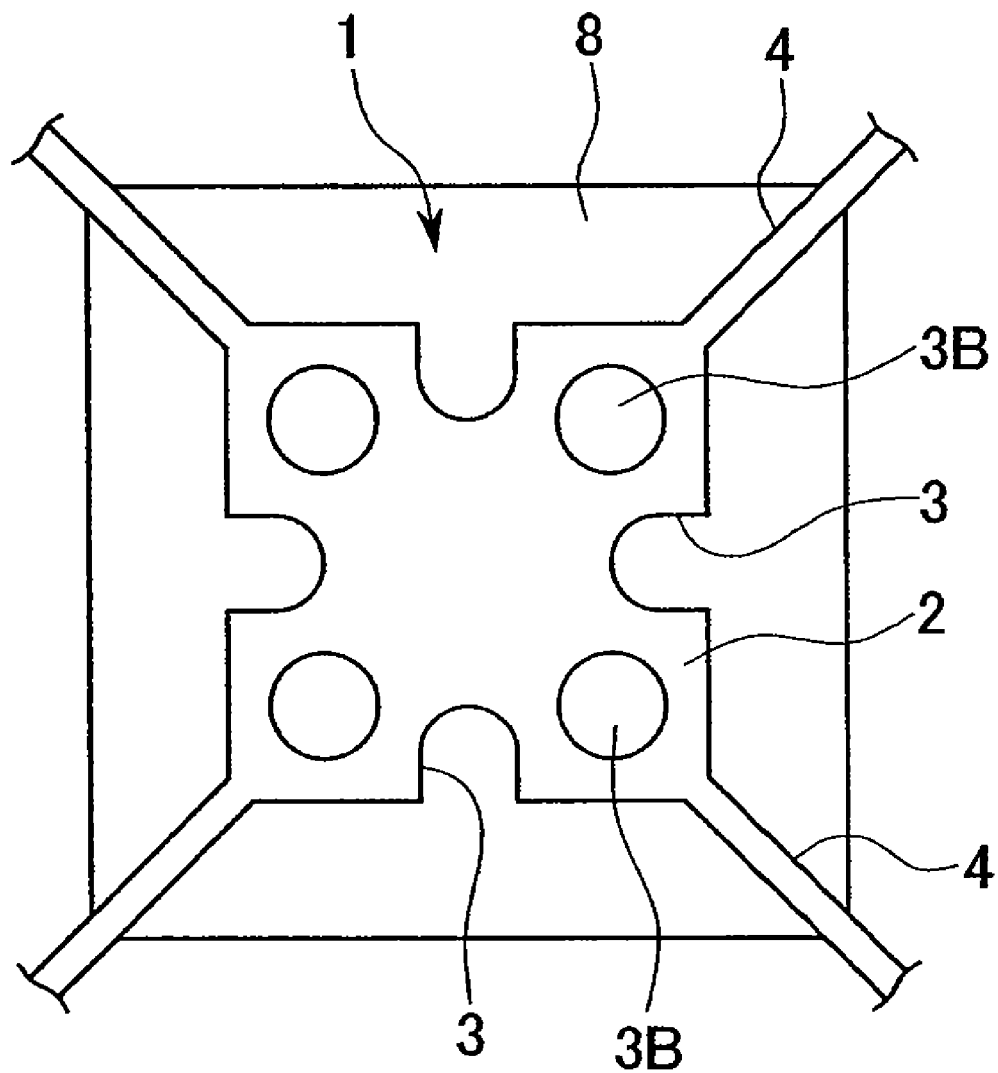
FIG. 14 is a backside view diagrammatically showing a semiconductor chip and a die stage of a lead frame in accordance with a fourth embodiment of the invention.

FIG. 14 shows the lead frame 1 and the semiconductor device 10 in accordance with the fourth embodiment of the invention, wherein the die stage 2 is provided with through holes 3B, which penetrate through the corner portions of the die stage 2, in addition to the semicircular cutouts 3.

Each of the through holes 3B is opened on both of the upper surface and backside of the die stage 2, wherein in the foregoing molding step, the molded resin 9 is introduced into the insides of the through holes 3B in addition to the cutouts 3, so that the molded resin 9 partially formed inside of the through holes 3B is joined with the backside of the semiconductor chip 8.

The fourth embodiment can demonstrate the same effects as offered in the first embodiment, wherein it is possible to further increase the overall contact area formed between the semiconductor chip 8 and the molded resin 9. In addition, the through holes 3B do not interfere with the respective sides of the die stage 2, which form the peripheral portion of the die stage 2; hence, in the foregoing wire bonding step, it is possible to maintain the stable condition secured for the die stage 2, which serves as the base for mounting the semiconductor chip 8. Incidentally, the fourth embodiment can be modified in such a way that the upper surface or backside of the die stage 2 is subjected to half etching at prescribed areas encompassing the through holes 3B.

Next, a fifth embodiment of the invention will be described, wherein parts identical to those used in the first to fourth embodiments are designated by the same reference numerals; hence, the detailed description thereof will be omitted.

Figure 15A:
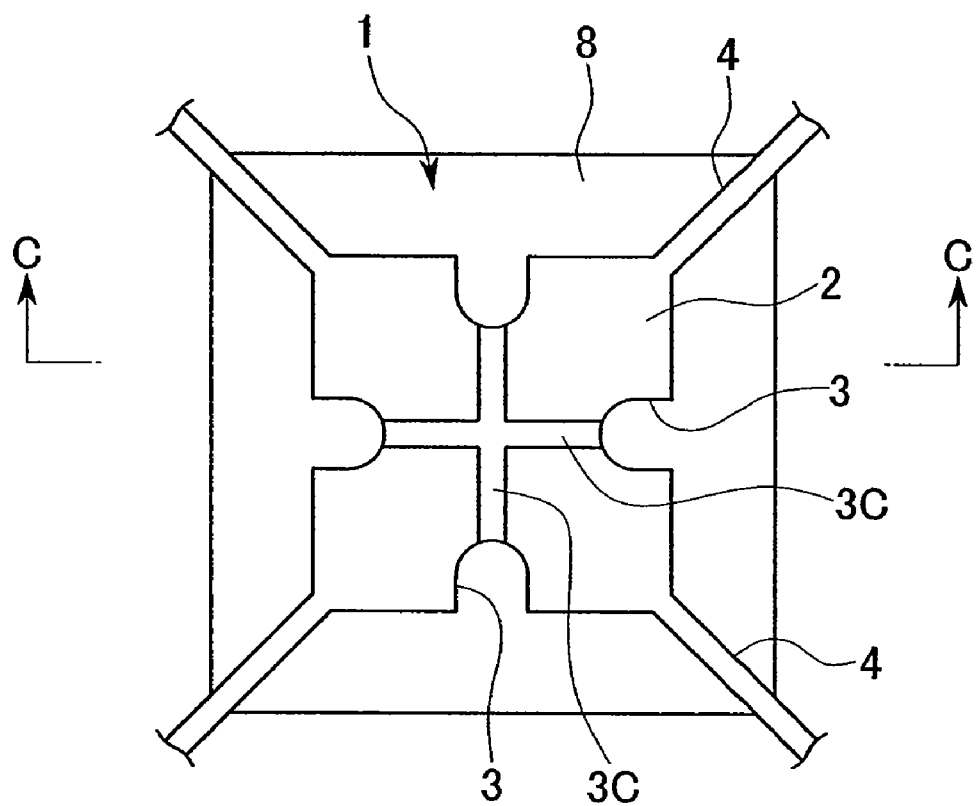
FIG. 15A is a backside view diagrammatically showing a semiconductor chip and a die stage of a lead frame in accordance with a fifth embodiment of the invention.
Figure 15B:
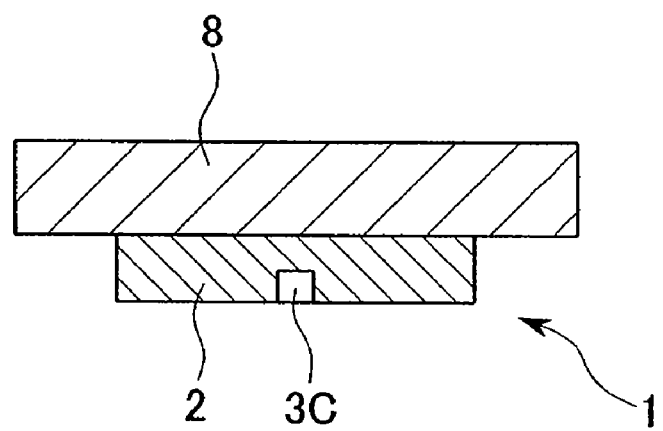
FIG. 15B is a cross sectional view taken along line C-C in FIG. 15A.

FIGS. 15A and 15B show the lead frame 1 and the semiconductor device 10 in accordance with the fifth embodiment of the invention, wherein third cutouts 3C are formed by performing half etching on the backside of the die stage so as to provide communication between the 'opposing' cutouts 3, which are formed at the centers of the respective sides of the die stage 2.

The third cutouts 3C are opened between the cutouts 3 in the backside of the die stage 2, wherein in the foregoing molding step, the molded resin 9 is introduced into the third cutouts 3C in addition to the cutouts 3.

The fifth embodiment can demonstrate the same effects as offered in the first embodiment, and it can also demonstrate the same effects as offered in the second embodiment.

Next, a sixth embodiment of the invention will be described, wherein parts identical to those used in the first to fifth embodiments are designated by the same reference numerals; hence, the detailed description thereof will be omitted.

Figure 16A:
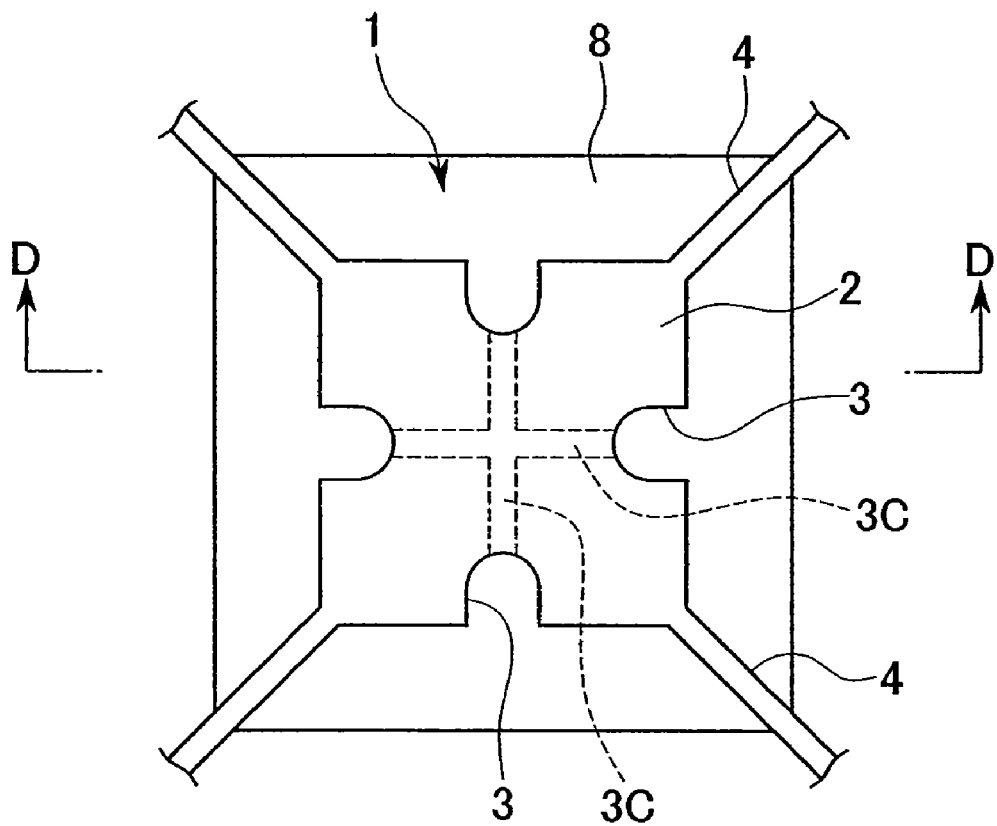
FIG. 16A is a backside view diagrammatically showing a semiconductor chip and a die stage of a lead frame in accordance with a sixth embodiment of the invention.
Figure 16B:
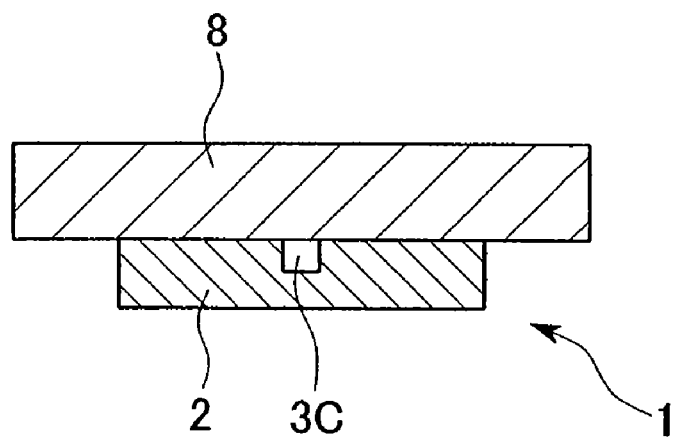
FIG. 16B is a cross sectional view taken along line D-D in FIG. 16A.

FIGS. 16A and 16B show the lead frame 1 and the semiconductor device 10 in accordance with the sixth embodiment of the invention, wherein the third cutouts 3C are formed by performing half etching on the upper surface of the die stage 2 so as to provide communication between the 'opposing' cutouts 3, which are formed at the centers of the respective sides of the die stage 2.

The third cutouts 3C are opened between the cutouts 3 in the upper surface of the die stage 2, wherein in the foregoing molding step, the molded resin 9 is introduced into the third cutouts 3C in addition to the cutouts 3, so that the molded resin 9 partially formed in the third cutouts 3C is joined with the backside of the semiconductor chip 8.

The sixth embodiment can demonstrate the same effects as offered in the first embodiment, and it can also demonstrate the same effects as offered in the third embodiment.

Next, a seventh embodiment of the invention will be described, wherein parts identical to those used in the first to sixth embodiments are designated by the same reference numerals; hence, the detailed description thereof will be omitted.

Figure 17:
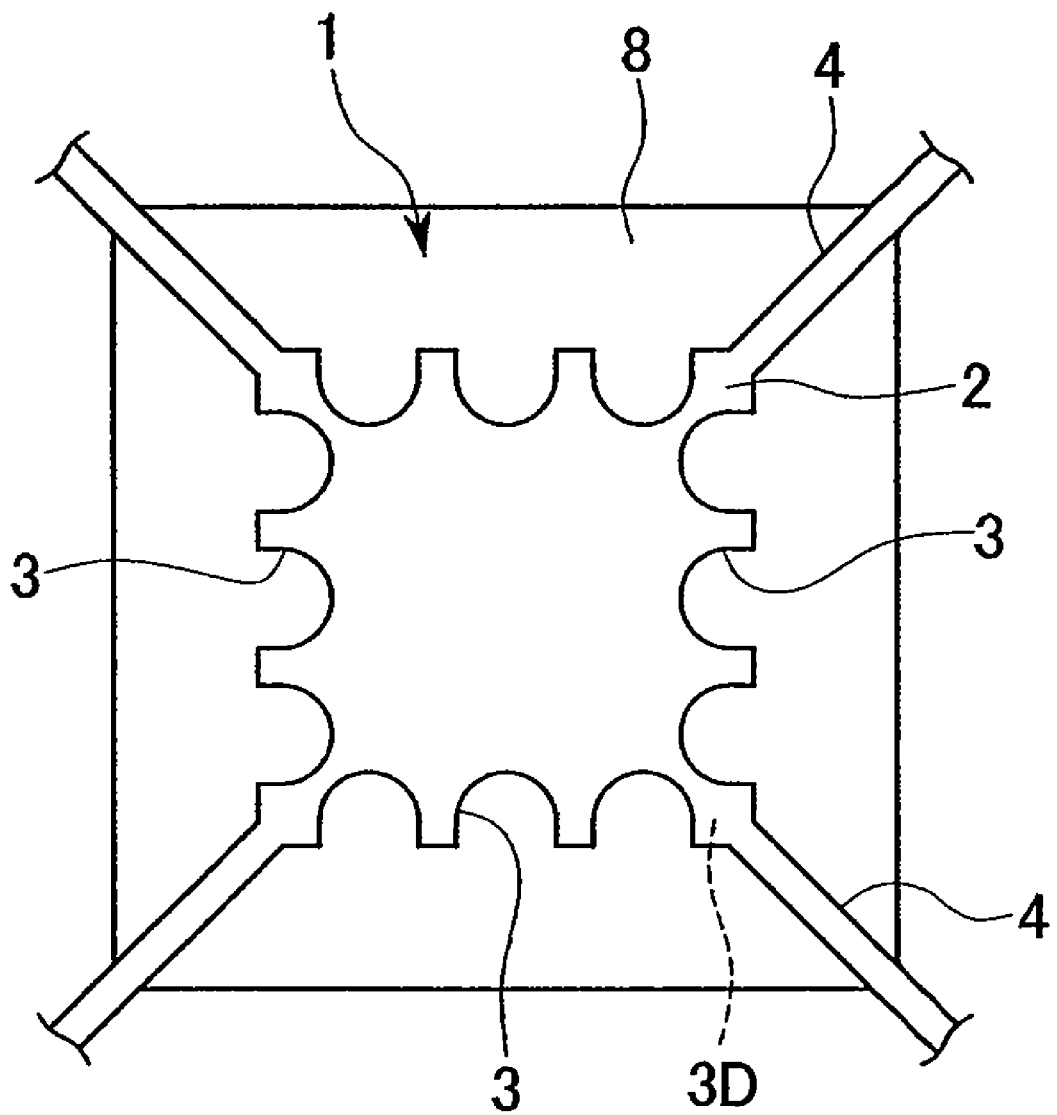
FIG. 17 is a backside view diagrammatically showing a semiconductor chip and a die stage of a lead frame in accordance with a seventh embodiment of the invention.

FIG. 17 shows the lead frame 1 and the semiconductor device 10 in accordance with the seventh embodiment of the invention, wherein a plurality of semicircular cutouts 3 are formed on each of the four sides of the die stage 2, so that it is possible to demonstrate the same effects as offered in the first embodiment.

Next, an eighth embodiment of the invention will be described, wherein parts identical to those used in the first to seventh embodiments are designated by the same reference numerals; hence, the detailed description thereof will be omitted.

Figure 18A:
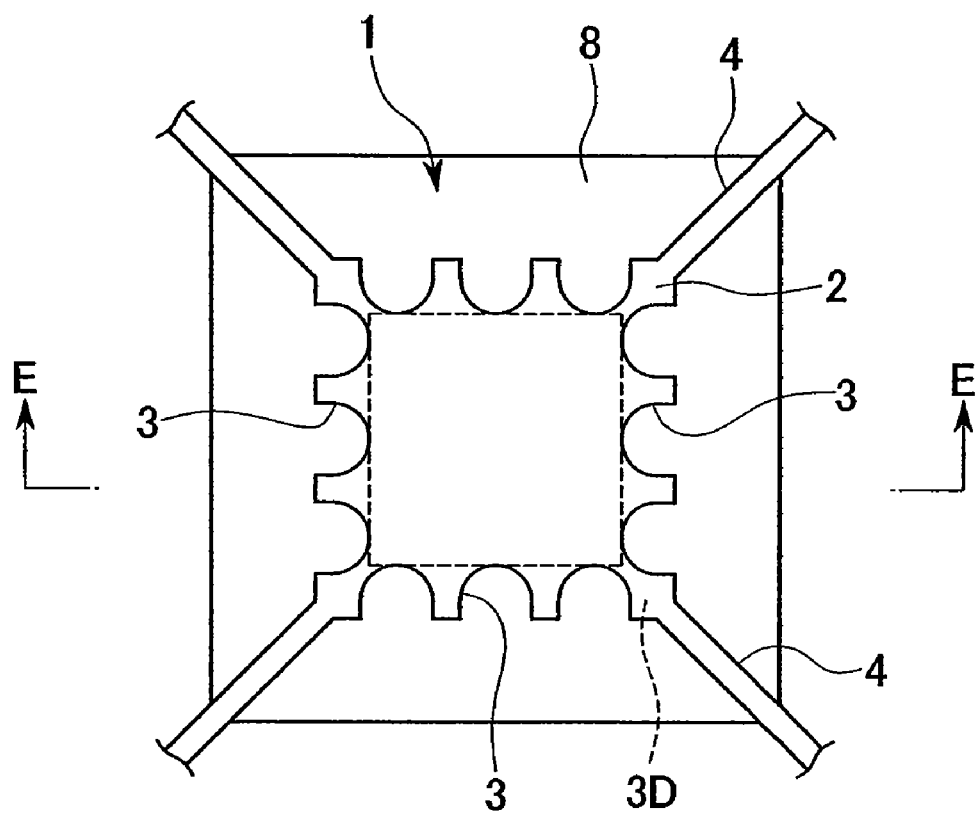
FIG. 18A is a backside view diagrammatically showing a semiconductor chip and a die stage of a lead frame in accordance with an eighth embodiment of the invention.
Figure 18B:
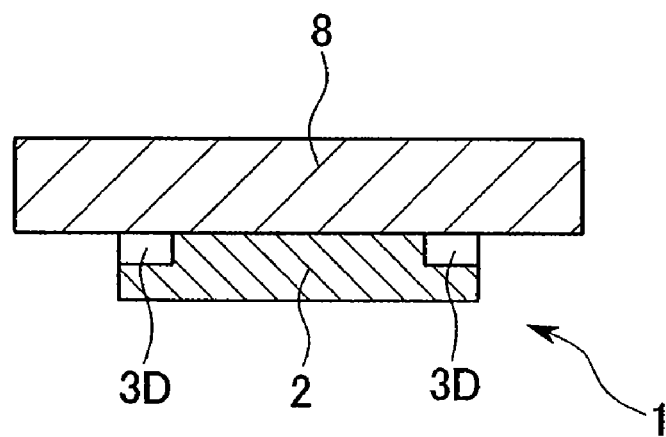
FIG. 18B is a cross sectional view taken along line E-E in FIG. 18A.
Figure 19:
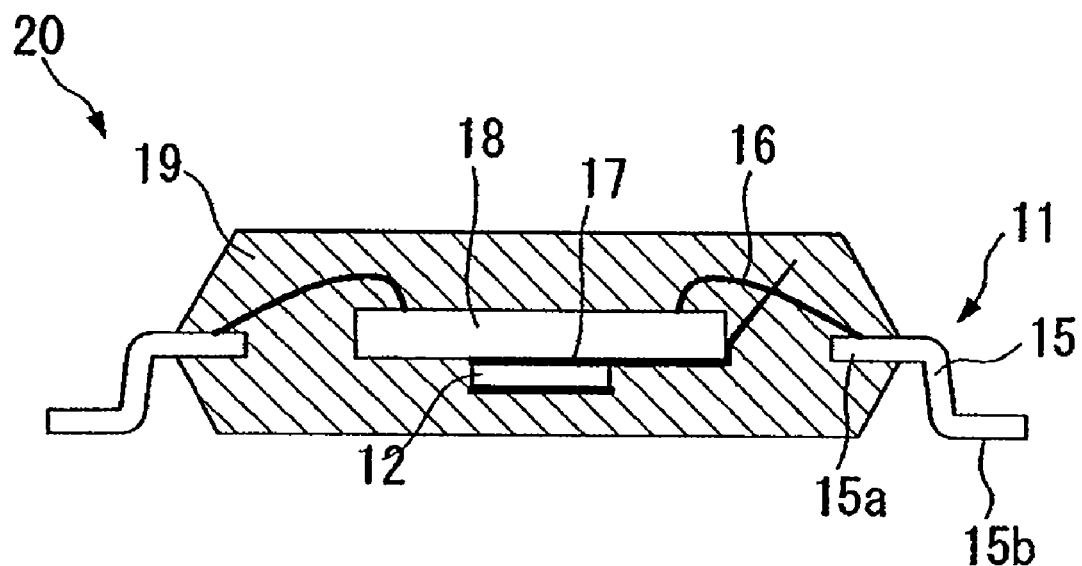
FIG. 19 is a cross sectional view showing the constitution of a conventionally-known semiconductor device.
Figure 20:
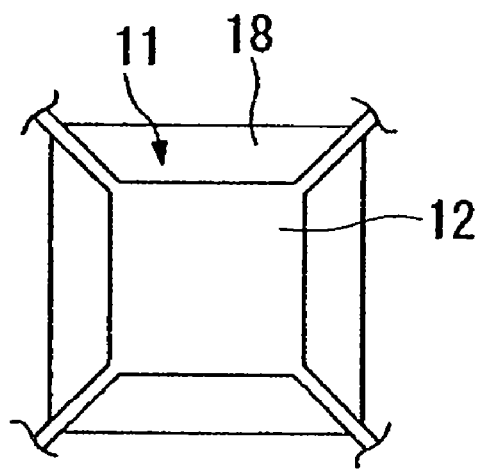
FIG. 20 is a plan view simply showing the relationship between a semiconductor chip and a die stage in the semiconductor device shown in FIG. 19.
Figure 21:
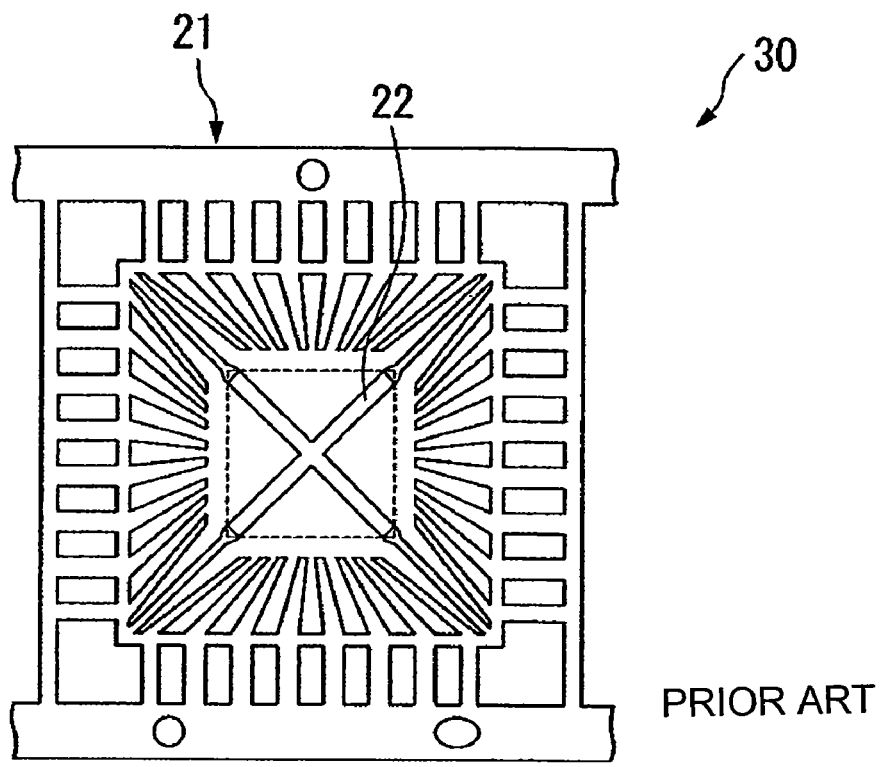
FIG. 21 is a plan view diagrammatically showing an example of the lead frame.
Figure 22:
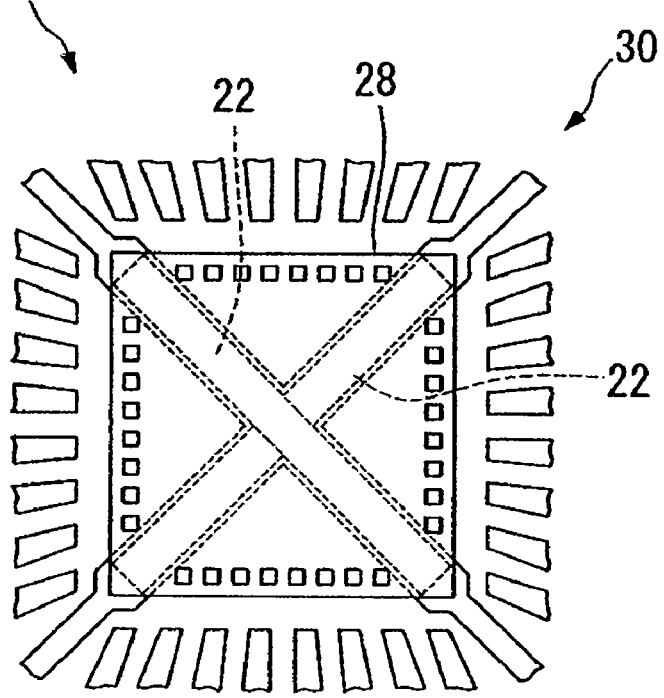
FIG. 22 is a plan view diagrammatically showing a semiconductor chip that is mounted on the lead frame shown in FIG. 21.
Figure 23:
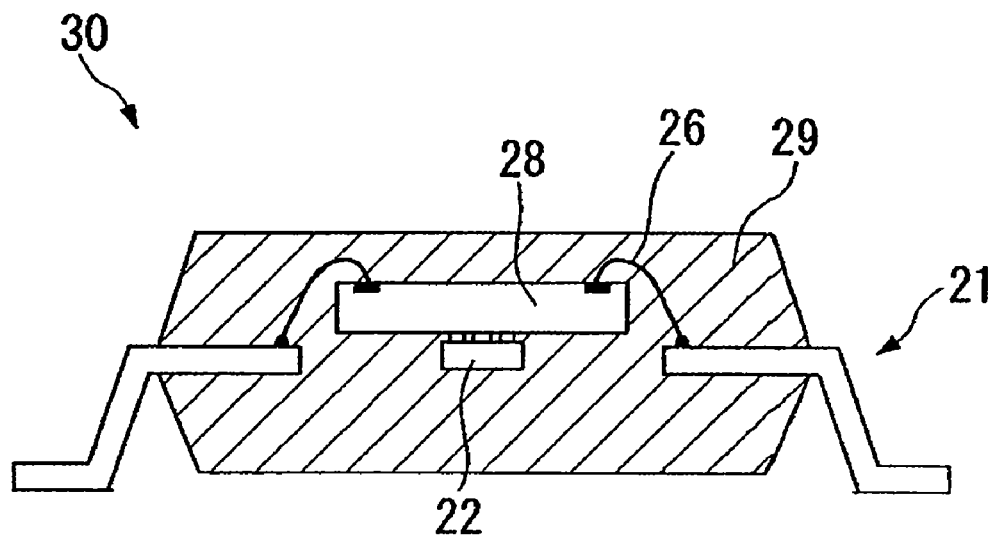
FIG. 23 is a cross sectional view showing the constitution of a conventionally-known semiconductor device having the lead frame shown in FIG. 21.
Figure 24:
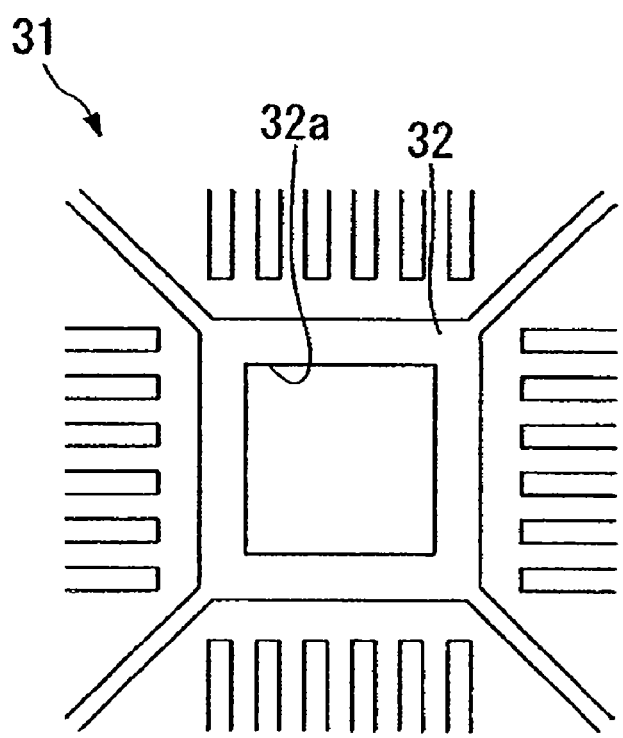
FIG. 24 is a plan view diagrammatically showing an example of the lead frame.
Figure 25:
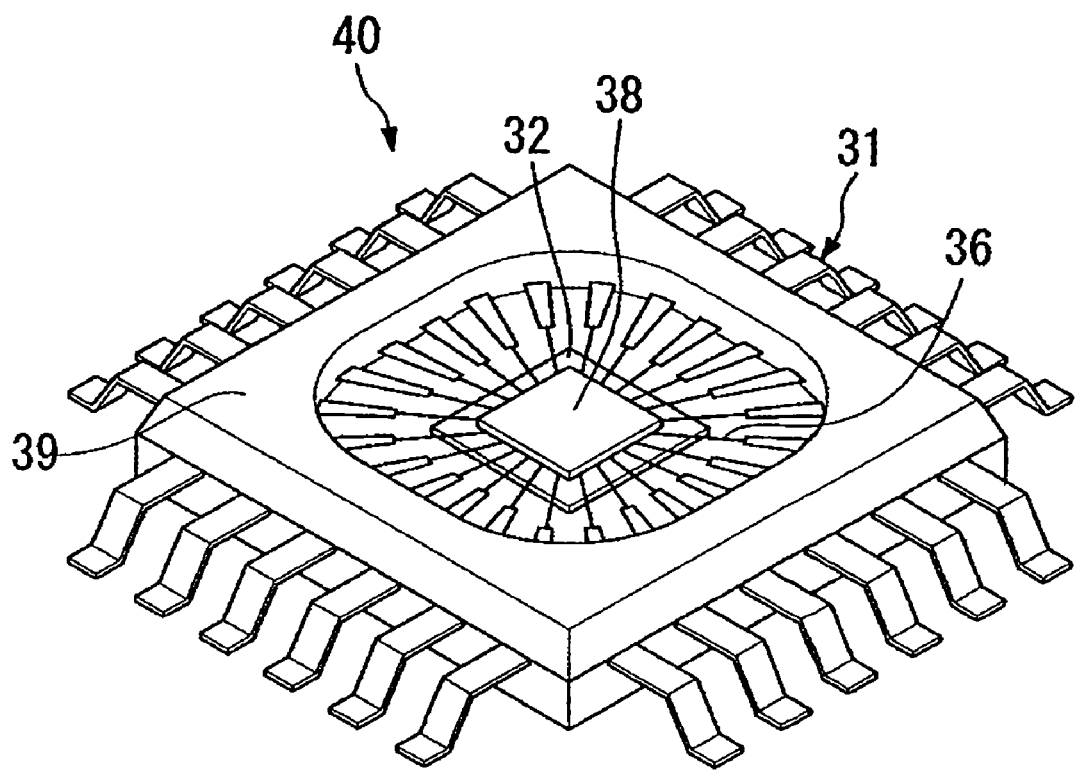
FIG. 25 is a perspective view showing the appearance of a conventionally-known semiconductor device having the lead frame shown in FIG. 24.

FIGS. 18A and 18B show the lead frame 1 and the semiconductor device 10 in accordance with the eighth embodiment of the invention, wherein a plurality of semicircular cutouts 3 are formed on each of the four sides of the die stage 2, and fourth cutouts 3D are formed by performing half etching on the upper surface of the peripheral portion of the die stage 2 including the cutouts 3.

The fourth cutouts 3D are opened between the cutouts 3 in the upper surface of the die stage 2 at its corners, wherein in the foregoing molding step, the molded resin 9 is introduced into the fourth cutouts 3D in addition to the cutouts 3, so that the molded resin 9 partially formed in the fourth cutouts 3D is joined with the backside of the semiconductor chip 8.

The eighth embodiment can demonstrate the same effects as offered in the first embodiment, and it can also demonstrate the same effects as offered in the third embodiment.

Incidentally, the cutouts 3 of the die stage 2 are not necessarily limited to a semicircular shape, and can be changed to a triangular shape or rectangular shape, for example.

As described heretofore, this invention has a variety of effects and technical features, which will be described below.

(1) A semiconductor device including a lead frame according to this invention is designed such that the outline of a die stage is shaped to be smaller than the outline of a semiconductor chip, whereby it is possible to minimize the separated area that may be formed in the boundary between the die stage and molded resin due to heating when the semiconductor device is soldered to the circuit board. This can prevent the separated area formed in proximity to the die stage from extending to the boundary between the semiconductor chip and molded resin; hence, it is possible to prevent bonding wires from being unexpectedly broken due to the formation of cracks caused by the growth of the separation.

(2) A plurality of cutouts are adequately formed in the peripheral portion of the die stage so that the molded resin formed inside of the cutouts can be firmly joined with the backside of the semiconductor chip. Therefore, even when separation occurs in the boundary between the die stage and molded resin, it does not extend towards the boundary between the semiconductor chip and molded resin; hence, it is possible to prevent the bonding wires from being unexpectedly broken due to the formation of cracks caused by the growth of the separation.

(3) As a result, even though non-lead solder not containing a toxic substance such as lead (Pb) is used to firmly combine the semiconductor device with the circuit board, it is possible to prevent the bonding wires from being unexpectedly broken due to the formation of cracks in the molded resin in the heating process. Thus, it is possible to increase the yield in the manufacture of electronic devices, which may contribute to the protection of the environment.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:
1. A semiconductor device comprising:
a rectangular shaped semiconductor chip;
a lead frame having a die stage with a top surface on which the semiconductor chip is mounted, the die stage having bottom surface, wherein an outline of the die stage is shaped so as to be smaller than an outline of the semiconductor chip, wherein the die stage has a rectangular shape with peripheral edges;
a plurality of cutouts formed on the peripheral edges of the die stage from the top surface to the bottom surface, such that the plurality of cutouts are formed inwardly with respect to the peripheral edges on four sides of the die stage;

at least one secondary cutout provided in the bottom surface of the die stage, the at least one secondary cutout being contiguous with and conforming to a shape of at least one of the plurality cutouts, the at least one secondary cutout not penetrating an entire thickness of the die stage wherein the at least one secondary cutout is formed toward a center of the die stage in relation to the at least one of the plurality of cutouts; and a molded resin for integrally enclosing the die stage, including the entire bottom surface, and the semiconductor chip, wherein the molded resin is introduced into at least one of the cutouts or the at least one secondary cutout of the die stage.

2. The semiconductor device according to claim 1, wherein the at least one secondary cutout comprises half-etched portions formed inside of the die stage.

3. The semiconductor device according to claim 1, wherein the lead frame is joined with a circuit board by use of non-lead solder.

4. The semiconductor device according to claim 1, wherein the at least one secondary cutout is formed on a backside of the die stage, opposite a side on which the semiconductor chip is mounted.

5. A lead frame comprising:

a die stage having a top surface and a rectangular shape for mounting a rectangular shaped semiconductor chip thereon, wherein an outline of the die stage is shaped to be smaller than an outline of the semiconductor chip and wherein the die stage has peripheral edges and a bottom surface;

a plurality of cutouts formed on the peripheral edges of the die stage from the top surface to the bottom surface such that the plurality of cutouts are formed inwardly with respect to the peripheral edges on four sides of the die stage; and at least one secondary cutout provided in the bottom surface of the die stage, the at least one secondary cutout being contiguous with and conforming to a shape of at least one of the plurality of cutouts, the at least one secondary cutout not penetrating an entire thickness of the die stage, wherein the at least one secondary cutout is formed toward a center of the die stage in relation to the at least one of the plurality of cutouts, wherein the die stage, including the entire bottom surface, and the semiconductor chip are integrally enclosed in a molded resin, which is introduced into at least one of the cutouts or the at least one secondary cutout of the die stage.

6. The lead frame according to claim 1, wherein the at least one secondary cutout comprises half-etched portions formed inside of the die stage.

7. The lead frame according to claim 1, wherein a length L2 set for each of the cutouts is defined in a range from (L1 ×0.05) to (L1 ×0.20) where L1 denotes a length set for each peripheral edge of the die stage.

8. The lead frame according to claim 1, wherein an overall area S2 of the die stage is defined in a range from (S1×0.10) to (S1×0.40) where S1 denotes an overall area of the semiconductor chip.

9. The lead frame according to claim 1, wherein the at least one secondary cutout is formed on a backside of the die stage, opposite a side on which the semiconductor chip is to be mounted.

* * * * *